US007868400B2

(12) United States Patent
Graovac et al.

(10) Patent No.: US 7,868,400 B2
(45) Date of Patent: Jan. 11, 2011

(54) APPARATUS FOR DRIVING A LOAD

(75) Inventors: Dusan Graovac, Munich (DE); Timo Dittfeld, Munich (DE); Frank Auer, Roehrmoos (DE)

(73) Assignee: Infineon Technologies AG, Neubiberg (DE)

( * ) Notice: Subject to any disclaimer, the term of this patent is extended or adjusted under 35 U.S.C. 154(b) by 349 days.

(21) Appl. No.: 11/944,826

(22) Filed: Nov. 26, 2007

(65) Prior Publication Data

US 2008/0211566 A1 Sep. 4, 2008

(30) Foreign Application Priority Data

Dec. 4, 2006 (DE) ........................ 10 2006 057 042

(51) Int. Cl.
*H01H 31/10* (2006.01)
*B60L 3/00* (2006.01)
*H01L 29/84* (2006.01)
(52) U.S. Cl. ........................ 257/415; 307/10.1; 307/115
(58) Field of Classification Search ................ 307/10.1, 307/115
See application file for complete search history.

(56) References Cited

U.S. PATENT DOCUMENTS

| 5,723,875 | A  | * | 3/1998  | Abe et al. ...................... 257/48 |
| 6,600,239 | B2 | * | 7/2003  | Winick et al. .................. 307/85 |
| 6,649,986 | B1 | * | 11/2003 | Ishizaki et al. ............... 257/415 |
| 7,209,819 | B2 | * | 4/2007  | Rothleitner .................. 701/45 |

FOREIGN PATENT DOCUMENTS

| DE | 19617250     | 9/1997  |
| DE | 102004028695 | 12/2005 |
| DE | 10255115     | 7/2007  |

OTHER PUBLICATIONS

German Office Action for DE102006057042.1-31 dated Jun. 28, 2007.

* cited by examiner

*Primary Examiner*—Michael Rutland Wallis
(74) *Attorney, Agent, or Firm*—Banner & Witcoff, Ltd.

(57) ABSTRACT

An apparatus for driving a load that may include, for instance, a semiconductor chip, comprising a first switch, and a fracture sensor. The apparatus may further include, for instance, a circuit disposed outside the semiconductor chip and comprising a second switch coupled in series with the first switch, and configured such that an on/off state of the second switch is set in accordance with a state of the fracture sensor.

20 Claims, 5 Drawing Sheets

APPARATUS FOR DRIVING A LOAD

CROSS-REFERENCE TO RELATED APPLICATIONS

The present application claims priority to German patent application no. 10 2006 057 042.1-31, filed Dec. 4, 2006, and hereby incorporated by reference as to its entirety.

BACKGROUND

Motor vehicles typically include passenger protection systems such as airbags or seatbelt pretensioners. Many of these protection systems are triggered by a firing element, for example a pyrotechnic firing cap (squib), which initiates further processes for opening an airbag or for tensioning a seatbelt. Such a firing cap is usually activated by virtue of the fact that a predefined activation current/firing current is applied to it for a predefined activation period by a drive circuit.

Circuit arrangements are known in which two semiconductor switches, with which the firing element is connected in series, are integrated into a common semiconductor body or semiconductor chip. During operation, a supply voltage is applied across the series circuit of the two semiconductor switches and the firing element, and the voltage gives rise to the firing current through the firing element when the two semiconductor switches are switched on.

The integration of the two semiconductor switches on one semiconductor chip can lead to a situation in which, when there is a serious fault on the chip, uncontrolled activation of the passenger protection system occurs. Such a serious fault may include the fracturing of the chip, for example due to thermal or mechanical stresses.

SUMMARY

Various aspects are described herein. For example, some aspects are directed to an apparatus for driving a load. The apparatus may include, for instance, a semiconductor chip, comprising a first switch, and a fracture sensor. The apparatus may further include, for instance, a circuit disposed outside the semiconductor chip and comprising a second switch coupled in series with the first switch, and configured such that an on/off state of the second switch is set in accordance with a state of the fracture sensor.

These and other aspects will be described in more detail in connection with various illustrative embodiments.

BRIEF DESCRIPTION OF THE DRAWINGS

Various illustrative embodiments are explained in more detail below with reference to figures. In this context it is to be noted that the figures serve only for illustration and that the component and circuit structures which are illustrated in the figures are not necessarily illustrated with correct dimensions and are not necessarily to scale. In the figures, unless stated otherwise, the same reference symbols designate the same elements.

DETAILED DESCRIPTION

Figure 1:
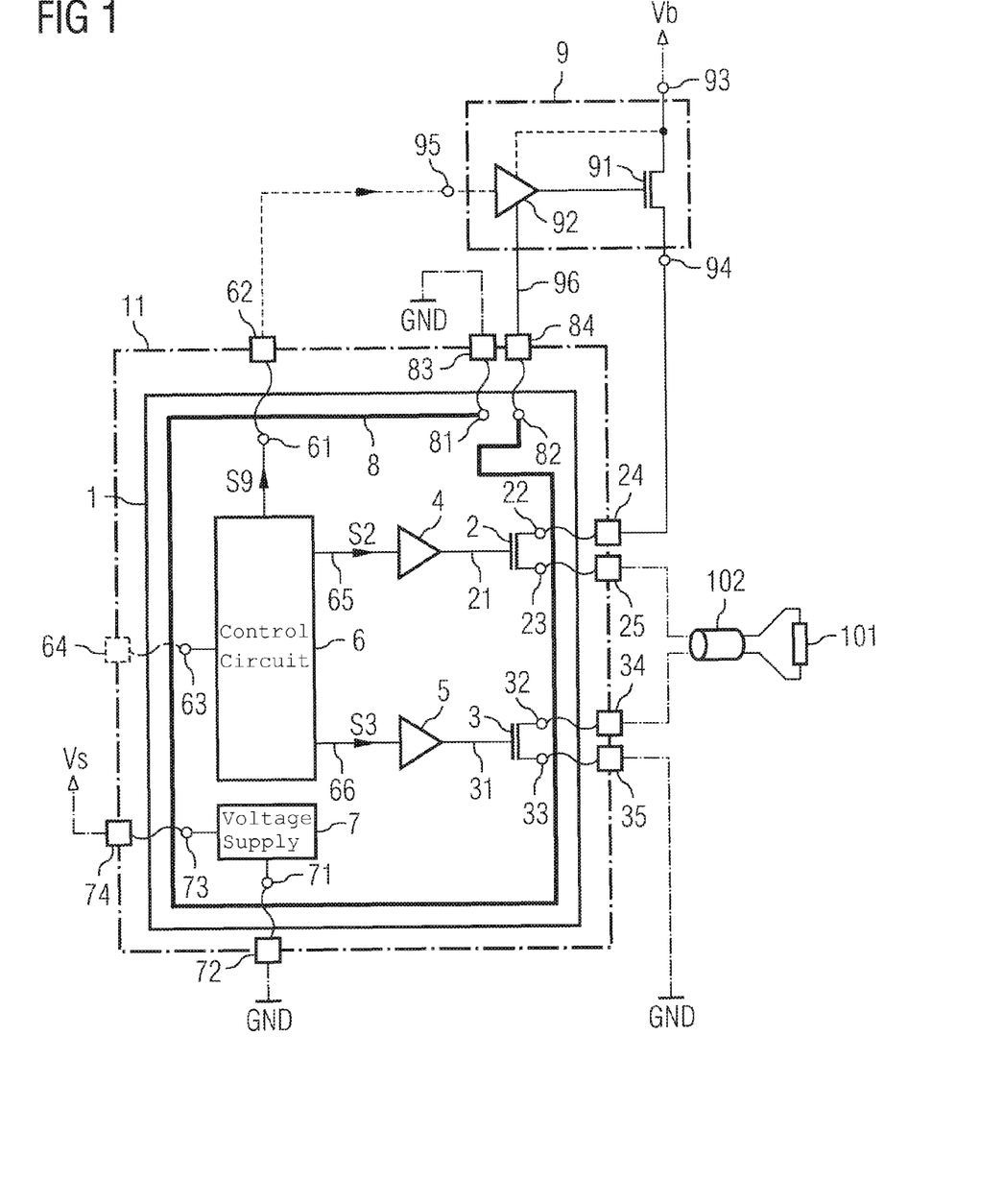
FIG. 1 shows an example of a circuit arrangement for driving a load which has a semiconductor body having at least one semiconductor switch which is integrated into the semiconductor body, and having a fracture sensor, and has an external protective circuit which is connected to the fracture sensor and has a further semiconductor switch.

FIG. 1 shows an example of a circuit arrangement for driving a load 101, which can be, for example, a firing element of a passenger protection system, such as a firing element of an airbag or of a seatbelt pretensioner. This particular circuit arrangement comprises a semiconductor body 1, which is illustrated schematically in FIG. 1 as a rectangular block and into which at least one semiconductor switch is integrated. In the embodiment illustrated in FIG. 1, a first and a second semiconductor switch 2, 3, which are illustrated in the form of their electrical symbols, are integrated into the semiconductor body 1. These semiconductor switches 2, 3 each have a control terminal 21, 31 and load paths between first load path terminals 22, 32 and second load path terminal 23, 33. These semiconductor switches 2, 3 are embodied, for example, as metal-oxide-semiconductor (MOS) transistors, such as MOS field-effect transistors (MOSFETs), or insulated-gate bipolar transistors (IGBTs), which each has a gate terminal as the control terminal 21 and drain and source terminals as load path terminals.

The semiconductor chip 1 is partially or fully surrounded by a housing 11 which is illustrated by dashed lines in FIG. 1 and which has connection terminals (such as connection pins) for making contact with individual components which are integrated into the semiconductor chip 1. Individual load terminals 22, 23, 32, 33 of the integrated semiconductor switches 2, 3 are each assigned one connection pin 24, 25, 34, 35 here, with the load terminals 22, 23, 24, 25 being connected to the respectively assigned connection pin by means of a bonding wire connection, for example. The load includes the firing element 101 and may also include, for example, a supply line 102 to the firing element 101, can be connected via these connection pins 22, 23, 24, in series with the load paths of the integrated semiconductor switches 2, 3. With reference to FIG. 1, the load is, for this purpose, connected, for example, between the second load path terminal 23 of the first semiconductor switching element 2 and the first load path terminal 32 of the second semiconductor switching element 3.

The first and second integrated semiconductor switches 2, 3 are driven as a function of drive signals S2, S3 which are generated by a control circuit 6 which is integrated into the semiconductor body 1. This control circuit 6 is connected, for example, by means of an input terminal 63 and an associated input pin 64 to sensors, for example acceleration sensors, which provide sensor signals in accordance with which the firing element 101 is to be triggered. Driver circuits 4, 5 are connected between the control circuit 6 and the drive inputs 21, 23 of the semiconductor switches 2, 3. These driver circuits are designed to convert the drive signals S2, S3, which are for example logic signals, to signals which are suitable for driving the semiconductor switches 2, 3. The driver circuits 4, 5 are matched here to the type of the respectively used semiconductor switch. These semiconductor switches 2, 3 can each be semiconductor switches of the same type, for example n-channel MOSFETs or IGBTs, or complementary semiconductor switches, i.e. for example the first semiconductor switch can be a p-channel MOSFET and the second semiconductor switch can be an n-channel MOSFET, or vice-versa.

A voltage supply of the circuit components which are integrated into the semiconductor body 1 is provided, for example, by a voltage supply circuit 7, which may be connected to the individual circuit components. This voltage supply 7 is connected via supply inputs 71, 73 to voltage supply pins 72, 74 to which a supply voltage can be applied. For this purpose, one of these voltage supply pins 74 is connected to a terminal for a positive supply potential Vs, while a second of these voltage supply pins 72 is connected during operation of the circuit arrangement to a terminal for a negative supply potential or reference potential GND.

The semiconductor body 1 has a fracture sensor 8 which is implemented in the illustrated example as an electrically conductive sensor line which, at least over part of its length, is mechanically coupled to a surface of the semiconductor body 1. This line, which is referred to below as a sensor line, is composed, for example, of metal or a doped polycrystalline semiconductor material such as polysilicon. This sensor line is, for example, electrically insulated from active component areas of the semiconductor body 1, i.e. from component areas in which doped semiconductor zones are arranged in order to implement the components which are integrated into the semiconductor body 1. The sensor line 8 can be, in particular, part of a wiring structure which is arranged above a surface of the semiconductor body 1. Such a wiring structure comprises for example a plurality of wiring planes or metallization planes with conductor tracks, in which case insulation layers may be arranged between the individual metallization planes. Conductor tracks in different planes can be connected to one another here by means of vertical cross connections, referred to as vias, and they serve to wire the semiconductor components which are integrated into the semiconductor body. The sensor line 8 can be implemented here as a conductor track of a metallization plane but it can also comprise a plurality of conductor track sections which are connected to one another in different metallization planes.

The mechanical coupling of the sensor line 8 to the surface of the semiconductor body 1 has the effect that, when there is a fracture in the semiconductor body 1 which results in a fissure in the surface of the semiconductor body 1, the sensor line 8 also fractures, which is evaluated in a way which will also be explained. In an arrangement of the sensor line 8 in a wiring structure above the surface of the semiconductor body 1, there is sufficient mechanical coupling of the sensor line to the surface so that it is possible to assume that, when there is a fracture of the semiconductor body 1, the layered configuration of the wiring structure, and thus the sensor line 8, also fractures. When a fracture occurs in the semiconductor body, a fissure usually starts in the edge region of the semiconductor body and propagates from there into the interior of the semiconductor body. In order to be able to detect such a fissure early and to be able to monitor the semiconductor body 1 as completely as possible, the sensor line 8 can be arranged in the edge region or above the edge region of the semiconductor body 1 and can be implemented in such a way that it follows the edge of the semiconductor body over its entire length, but without being short-circuited. It is possible to make contact with the sensor line 8 at one end via a first terminal contact 81, and at a second end facing away from the first end via a second terminal contact 82.

The circuit arrangement illustrated in FIG. 1 also has an external protective circuit 9, i.e. one which is arranged outside the semiconductor body 1, with a further semiconductor switch 91 and a driver circuit 92 for the further semiconductor switch 91. This driver circuit 92 is connected to the sensor line 8 and is designed to switch off the further semiconductor switch 91 when there is a fracture in the sensor line 8, and thus as a function of an operating state of the sensor line 8.

The further semiconductor switch 91 is implemented, for example, as a MOS transistor and has a control terminal which is connected to the driver circuit 92, and a load path which extends between first and second load terminals 93, 94. The load path of this further semiconductor switch 91 can be connected in series with the load paths of the semiconductor switches 2, 3 which are integrated into the semiconductor body 1 and in series with the load 101. In the illustrated example, the load path 93-94 of this further semiconductor switch 91 is connected directly in series with the first semiconductor switch 2 which is integrated into the semiconductor body 1.

The driver circuit 92 of the further semiconductor switching element 91 has a first drive input 96 which is connected via a connection pin 84 to the second connection terminal 82 of the sensor line 8. The first terminal 81 of the sensor line 8 can be connected hereby via a further connection pin 83 to an external supply potential, for example reference potential GND.

The driver circuit 92 of the protective circuit 9 may have a second drive input 95 which is connected via a drive pin 62 to a further output 61 of the control circuit 6. In this variant, the semiconductor switching element 91 of the protective circuit is also driven via the control circuit 6, making it possible to provide that switching on of the semiconductor switching element 91 of the protective circuit occurs together with switching on of the semiconductor switching elements 2, 3 which are integrated into the semiconductor body 1.

While the circuit arrangement is operating, the load paths of the semiconductor switches 2, 3 which are integrated into the semiconductor body 1 and of the semiconductor switching element 91 of the protective circuit 9 are connected in series with one another and in series with the firing element 101, with the firing element in the illustrated example being connected between the two integrated semiconductor switches 2, 3. This series circuit is connected between supply potential terminals, with, for example, the load terminal 93, facing away from the semiconductor body 1, of the semiconductor switching element 91 of the protective circuit being connected to a terminal for a positive supply potential Vb, and the second load terminal 35, facing away from the firing element 101, of the second semiconductor switching element 3 which is integrated into the semiconductor body 1 being connected to a terminal for negative supply potential or reference potential GND. In order to fire the firing element 101, the control circuit 6 switches on the two integrated semiconductor switches 2, 3 and the semiconductor switching element 91 of the protective circuit 9 for a predefined time period, as a result of which the firing element 101 is supplied with a firing current via the series circuit of the integrated semiconductor switches 2, 3 and of the external semiconductor switch 91, and can trigger.

Fracturing of the semiconductor body 1 constitutes a serious fault whose occurrence makes it unlikely that satisfactory functioning of the circuit arrangement will occur thereafter. In order to prevent faulty triggering of the firing element 101 when there is such a fracture in the semiconductor body 1, the driver circuit 92 switches off the semiconductor switching element 91 of the protective circuit 9 when there is such a fault, thus preventing, even if the integrated semiconductor switches 2, 3 are switched on, a firing current from flowing through the firing element 101, and thus preventing triggering of the firing element 101. In this circuit arrangement, fracturing of the semiconductor body 1 is detected via the sensor line 8 which has an electrically conductive path between the terminals 82, 83, which path is interrupted when the semiconductor body 1 fractures.

Figure 2:
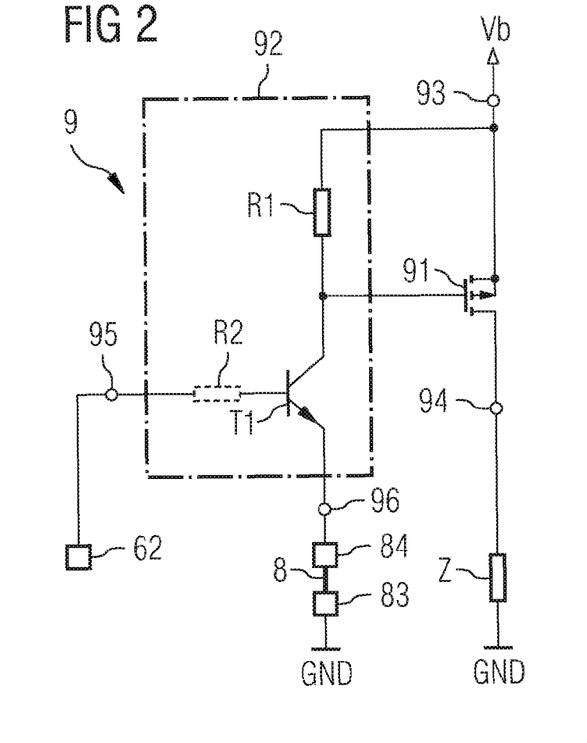
FIG. 2 shows an example of the protective circuit with a semiconductor switch which is embodied as a p-type conductive MOSFET.

A first implementation example of the driver circuit 92 which detects an interruption in the sensor line 8 is illustrated in FIG. 2. Of this semiconductor body, FIG. 2 shows only the drive pin 62, connected to the second drive input 95 of the driver circuit, and the connection pins 83, 84 for the sensor line 8. A load Z which is connected to the second load terminal 94 of the further semiconductor switching element 91 represents in FIG. 2 the series circuit with the two semiconductor switches (2, 3 in FIG. 1), which are integrated into the semiconductor body, and the firing element (101 in FIG. 1).

The semiconductor switching element 91 of the protective circuit 9 which is illustrated in FIG. 2 may be implemented as a p-type conductive MOSFET whose source terminal forms the first load terminal which is connected to the terminal for the positive supply potential Vb during operation. In this protective circuit, the driver circuit 92 comprises a first resistor element R1 which is connected between the gate terminal and the source terminal of the MOSFET 91, and a semiconductor switching element T1 which is embodied in the example as an npn bipolar transistor and has a control terminal (base terminal) and a load path (collector-emitter path). The load path of this bipolar transistor is connected to the gate terminal of the MOSFET 91 and is connected in series with the sensor line 8. The first terminal 83, facing away from the bipolar transistor T1, of the sensor line 8 is connected during operation here to a supply potential which is lower than the supply potential Vb to which the source terminal of the MOSFET 91 is connected. This supply potential which is applied to the first terminal 83 of the sensor line 8 is, for example, the reference potential GND. The base terminal of the bipolar transistor T1 is connected via the drive pin 62 to the control circuit 6 (not illustrated in FIG. 2). A further resistor element R2 which is connected between the drive pin 62 and the base terminal is optionally present and serves as a series resistor for protecting the bipolar transistor against excessively high base currents.

An illustrative method of operation of the protective circuit which is illustrated in FIG. 2 will be explained below. The MOSFET 91 is conductive, thus permitting current to flow through the downstream load arrangement Z when its gate terminal is at an electrical potential which is lower by the value of the threshold voltage of this MOSFET 91 than the electrical potential at its source terminal 93. This is brought about in the protective circuit 9 illustrated in FIG. 2 if there is an electrically conductive connection between the gate terminal and the reference potential GND. This is equivalent to the bipolar transistor T1 being switched on under the control of the control circuit 6 and at the same time the sensor line 8 being intact, i.e. not interrupted. If one of these two conditions is not met, that is to say if the sensor line 8 is interrupted or if the bipolar transistor T1 is switched off, the gate potential of the MOSFET 91 is drawn to the value of the source potential via the first resistor element R1, as a result of which the MOSFET 91 switches off. In this context it is to be noted that the resistance value of the first resistor element R1 is higher, ideally substantially higher, than the ohmic resistance of the series circuit of the bipolar transistor T1 and of the sensor line 8 when the bipolar transistor T1 is switched on and the sensor line 8 is intact.

If semiconductor chip 1 in the explained circuit arrangement fractures and if as a result the sensor line 8 is interrupted, the MOSFET 91 of the protective circuit 9 switches off irrespective of whether the control circuit makes available a suitable drive potential for switching on the bipolar transistor T1 and thus for switching on the MOSFET 91. This may reliably prevent, in the event of the semiconductor chip 1 fracturing, a current from being able to flow through the load arrangement Z which is connected downstream of the semiconductor switching element 91 of the protective circuit 9, which may reliably prevent triggering of the firing element (101 in FIG. 1).

Figure 3:
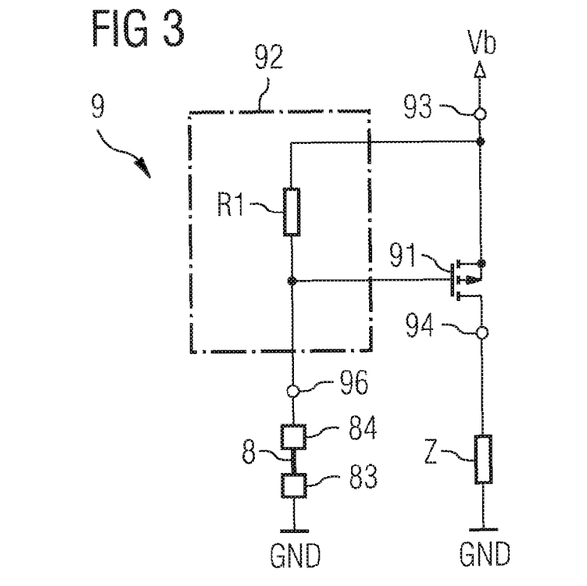
FIG. 3 shows another example of the protective circuit with a semiconductor switch which is embodied as a p-type conductive MOSFET.

The previously explained driving of the semiconductor switching element 91 of the protective circuit 9 via the drive pin 62 of the control circuit serves to reduce the current drain of the circuit arrangement and permits the semiconductor switching element 9 to be switched on via the control circuit 6 only when the firing element 101 is to trigger, i.e. when the two integrated semiconductor switching elements 2, 3 are also to be switched on by the control circuit 6. With regard to the desired protective function of the protective circuit 9 which, in the event of an interruption of the sensor line 8, is intended to prevent a flow of current through the downstream load arrangement Z, it is possible to dispense with driving by means of the control circuit 6 and thus with the bipolar transistor T1. In this example, the sensor line 8 is connected directly to the control terminal of the semiconductor switching element 9 via the second terminal of said sensor line 8. This variant is illustrated in FIG. 3.

Figure 4:
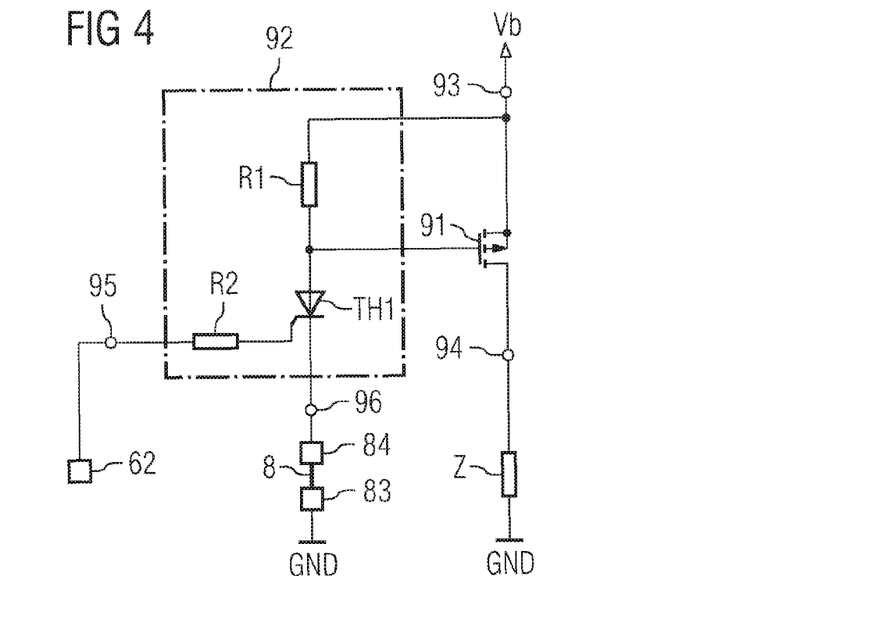
FIG. 4 shows another example of the protective circuit with a semiconductor switch which is embodied as a p-type conductive MOSFET.

FIG. 4 show a modification of the protective circuit illustrated in FIG. 2. In this protective circuit illustrated in FIG. 4, a thyristor TH1, instead of a bipolar transistor, is connected in series with the sensor line 8 between the gate terminal of the MOSFET 91 and the terminal for reference potential GND. An anode terminal of the thyristor is connected here to the gate terminal of the MOSFET 91, and a cathode terminal of the thyristor TH1 is connected to the sensor line 8. A firing terminal of the thyristor TH1 is connected via a series resistor R2 to the drive pin 62 of the control circuit 6.

Figure 5:
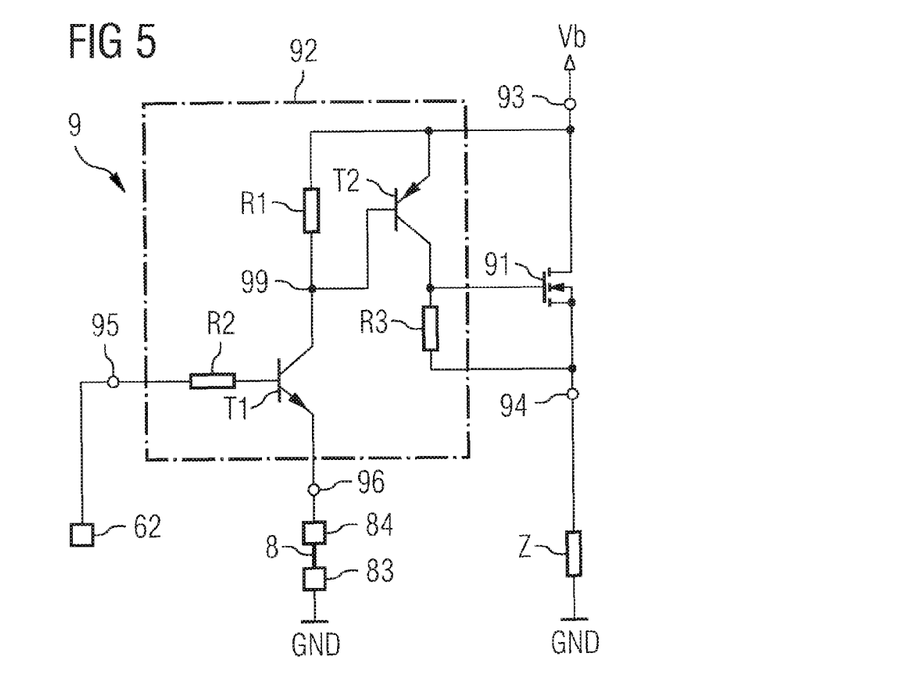
FIG. 5 shows another example of the protective circuit with a semiconductor switch which is embodied as an n-type conductive MOSFET.

FIG. 5 shows a further exemplary embodiment of the protective circuit 9. The semiconductor switching element 91 is embodied in this exemplary embodiment as an n-type conductive MOSFET whose drain terminal forms the first load terminal 93 which is connected to the positive supply potential Vb, and whose source terminal forms the second load terminal 94. This MOSFET 91 is switched on if a drive potential which is above the potential of the source terminal 94 by at least the value of the threshold voltage of this transistor 91 is applied to the gate terminal of said MOSFET 91. The driver circuit 92 for driving this MOSFET has, in addition to the components of the driver circuit 92 which have already been explained with reference to FIG. 2, an inverting circuit which is connected between the terminal 99, which is common to the first resistor element R1 and the bipolar transistor T1, and the gate terminal of the MOSFET 91. This inverting circuit comprises in the example a further bipolar transistor T2 which is implemented as a pnp-type bipolar transistor and which is connected between the drain terminal and the gate terminal of the MOSFET 91, as well as a further resistor element R3 which is connected between the gate terminal and the source terminal of the MOSFET 91. If the input of the inverting circuit which is formed by the common node of the first resistor element and of the first bipolar transistor T1 is approximately at reference potential when the first bipolar transistor T1 is switched on and the sensor line 8 is intact, the further bipolar transistor T2 is switched on, as a result of which the MOSFET 91 switches on. If the input 99 of the inverting circuit is at the positive supply potential Vb when the bipolar transistor T1 is switched off and the sensor line 8 is interrupted, the further bipolar transistor T2 switches off, as a result of which the gate potential of the MOSFET is drawn approximately to the value of the source potential via the further resistor R3 so that the MOSFET 91 switches off.

Of course, in the protective circuit which is illustrated in FIG. 5, it is also possible to dispense with the bipolar transistor T1, for example if only a protective function and not additional driving of the semiconductor switch 91 via the control circuit 6 is desired. In this case, in accordance with the exemplary embodiment in FIG. 3, the sensor line 8 may be connected directly to the circuit node 99.

Figure 6:
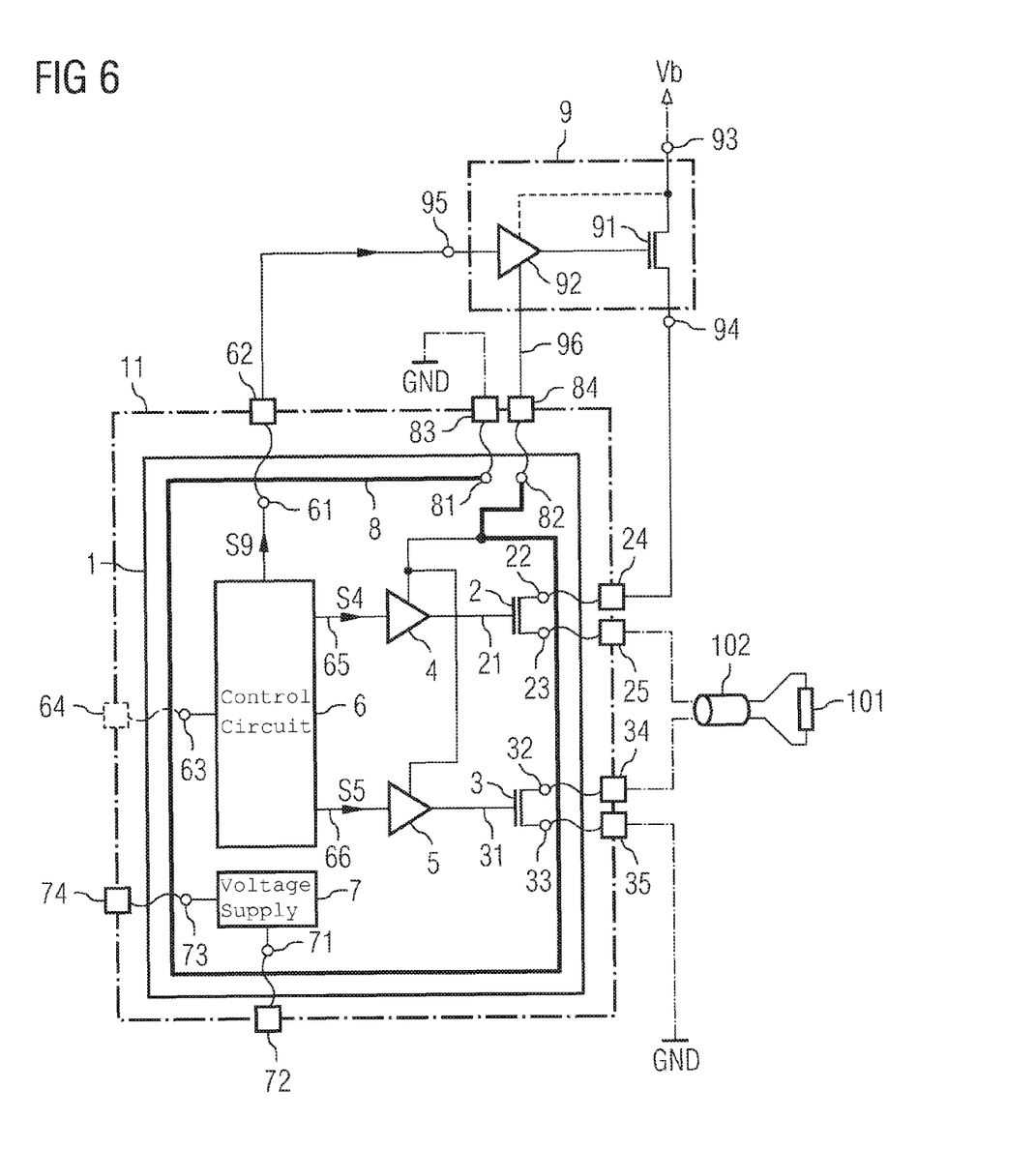
FIG. 6 shows another example of the circuit arrangement in which the at least one semiconductor switch which is integrated into the semiconductor body is driven as a function of an operating state of the fracture sensor.

FIG. 6 shows a further exemplary embodiment of the circuit arrangement. In this exemplary embodiment, the semiconductor switches 2, 3 which are integrated into the semiconductor chip 1 are also driven as a function of the operating state of the sensor line 8. The driver circuits 4, 5 of these integrated semiconductor switches 2, 3 are for this purpose connected to the sensor line 8 and designed to detect an interruption in the sensor line 8 and to switch off the semiconductor switches 2, 3 if there is an interruption in the sensor line.

Figure 7:
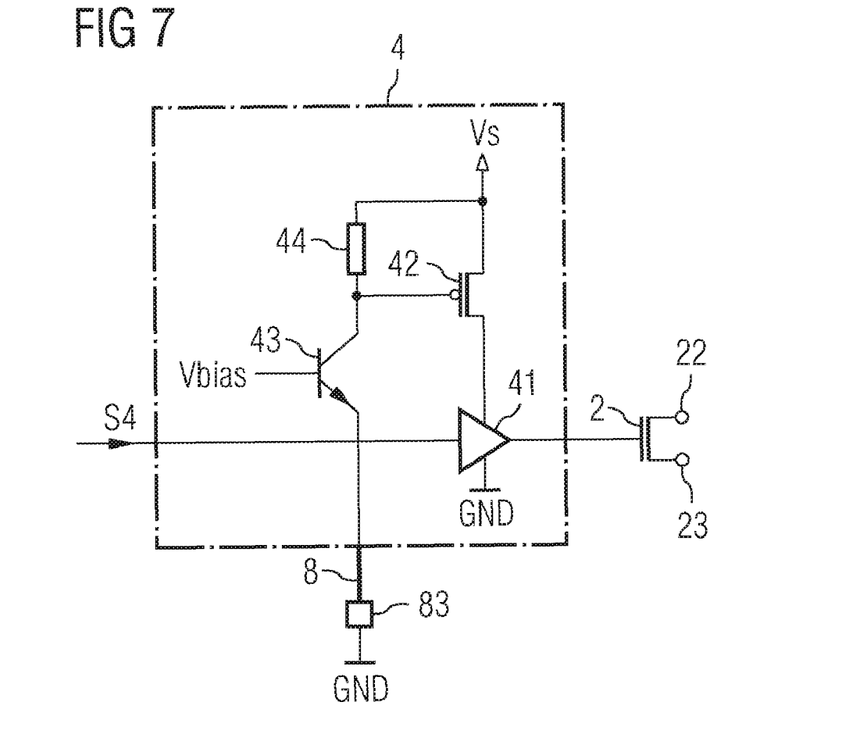
FIG. 7 shows an example of a driver circuit for driving the semiconductor switch which is integrated into the semiconductor body.

A possible exemplary embodiment of a driver circuit with such functionality is explained below with reference to FIG. 7 for the driver circuit 4 of the first integrated semiconductor switch 2. This driver circuit 4 has a driver 41 to which the drive signal S4, according to which the semiconductor switch 2 is to be switched on or off, is fed and which makes available, as a function of this drive signal S4, a suitable drive signal for switching the semiconductor switch 2 on or off. This driver 41 can be a conventional driver suitable for driving the semiconductor switch 2. In the circuit configuration illustrated in FIG. 6, the driver is to be embodied as what is referred to as a high side driver when two n-channel MOSFETs or two IGBTs are used as semiconductor switches 2, 3, said high side driver making available, for the purpose of switching on the semiconductor switch, a drive potential which is higher than the positive supply potential Vb of the circuit arrangement. What is referred to as a low side driver which, for the purpose of switching on this semiconductor switch 3, generates a drive potential which is above the reference potential GND merely by the value of the threshold voltage of the semiconductor switch 3, is sufficient for driving the second integrated semiconductor switch 3.

The driver 41 of the driver circuit 4 has voltage supply terminals for applying a supply voltage and a switch 42 which is connected between one of the supply terminals and a terminal for supply potential Vs, said switch 42 being switched on or off as a function of the operating state of the sensor line 8. In the illustrated example, the switch 42 is a p-conducting MOS transistor which is connected between a terminal for a positive supply potential Vs and the associated supply potential terminal of the driver circuit 41. The load path of a bipolar transistor 43, in the example an npn-type bipolar transistor, is connected to the gate terminal of the MOS transistor 42, in series with the sensor line 8. A bias voltage Vbias, which keeps the bipolar transistor 43 continuously switched on, is connected to a base terminal of this bipolar transistor 43. A resistor element 44 is connected between the gate terminal of the MOS transistor 42 and the terminal for the positive supply potential Vs. If the sensor line 8 is intact in this circuit arrangement, the gate terminal of the MOS transistor 42 is at a potential which is lower than the positive supply potential Vs, as a result of which the MOS transistor 42 switches on. As a result, the driver 41 is supplied with a supply voltage in order to switch the semiconductor switch 2 on or off as a function of the drive signal S4. If the sensor line 8 is interrupted, the potential at the gate terminal of the MOS transistor 42 is drawn to the value of the positive supply potential Vs, as a result of which the MOS transistor 42 switches off and consequently interrupts a voltage supply of the driver 41. The driver 41 is embodied here in such a way that, when a voltage supply is not present, it switches off the associated semiconductor switch 2. This may provide that when the sensor line 8 is interrupted, i.e. when there is a fracture in the chip, the semiconductor switches 2, 3 which are integrated into the semiconductor chip 1 may be reliably prevented from being switched on.

Figure 8:
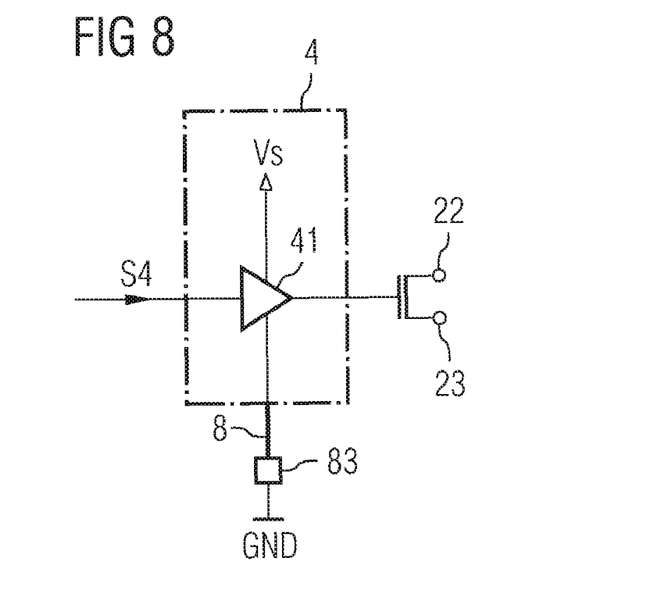
FIG. 8 shows a further example of a driver circuit for driving the semiconductor switch which is integrated into the semiconductor body.

The concept, explained with reference to FIG. 7, of switching off the integrated semiconductor switches 2, 3 by interrupting the voltage supply of the associated driver circuits 4, 5 can be implemented more easily in terms of circuit technology by virtue of the fact that the supply terminal which is connected to the negative supply potential or reference potential during operation is connected to this supply potential via the sensor line 8, which is illustrated in FIG. 8. A voltage supply of the driver circuit 41 is directly interrupted here when there is an interruption in the sensor line 8.

The concept, explained with reference to FIGS. 7 and 8, of switching off the integrated semiconductor switches 2, 3 by interrupting the voltage supply to the associated driver switches 4, 5 can also be applied (in a way not illustrated in more detail) to the driving of the semiconductor switch 91 of the protective circuit 9 by virtue of the fact that a driver circuit is provided here which is supplied with a voltage as a function of an operating state of the sensor line 8 and which switches off the semiconductor switch in the unsupplied state.

In the previously explained circuit arrangements, two semiconductor switches 2, 3 are integrated into the semiconductor chip 2 for safety reasons, and said semiconductor switches 2, 3 are connected in series with the firing element 101 when the circuit arrangement is operating, and they have to both be switched on for the firing element to be fired. There is, of course, also the possibility of integrating just one semiconductor switching element into the semiconductor chip 1, in which case the firing element 101 is to be connected either between this semiconductor switching element and reference potential GND or between this semiconductor switching element and the protective circuit 9.

The invention claimed is:

1. An apparatus for driving a load, comprising:
   a semiconductor chip, comprising:
      a first switch, and
      a fracture sensor; and
   a circuit disposed outside the semiconductor chip and comprising a second switch coupled in series with the first switch, and configured such that an on/off state of the second switch is set in accordance with a state of the fracture sensor,
   wherein the first switch is configured such that an on/off state of the first switch is set in accordance with the state of the fracture sensor.

2. The apparatus of claim 1, wherein the fracture sensor comprises a conductive line that is mechanically coupled to a surface of the semiconductor body.

3. The apparatus of claim 1, wherein the fracture sensor comprises a conductive line surrounding the first switch.

4. The apparatus of claim 1, wherein the fracture sensor comprises a conductive line comprising a first terminal coupled to an electrical potential, and a second terminal coupled to the circuit.

5. The apparatus of claim 1, wherein fracture sensor comprises a conductive line mechanically attached to the semiconductor chip, and the second switch is configured to turn off responsive to the conductive line being interrupted.

6. The apparatus of claim 1, wherein the fracture sensor comprises a conductive line mechanically attached to the semiconductor chip, and wherein the circuit has a voltage supply terminal configured to receive a supply voltage via the conductive line.

7. The apparatus of claim 1, wherein the semiconductor chip further comprises a control circuit configured to set the on/off state of the first and second switches.

8. The apparatus of claim 1, wherein the first and second switches are coupled in series with the load.

9. The apparatus of claim 1, wherein the apparatus is configured to switch both the first and second switches into an off state responsive to the fracture sensor detecting a fracture.

10. An apparatus for driving a load, comprising:
 a semiconductor chip, comprising:
  first, second, third, and fourth conductors extending outside the semiconductor chip,
  a first transistor having a gate, a first source/drain node coupled to the first conductor, and a second source/drain node coupled to the second conductor, and
  a conductive line coupled to the third and fourth conductors; and
 a circuit disposed outside the semiconductor chip and comprising:
  a second transistor having a gate, a first source/drain node, and a second source/drain node coupled to the first conductor, and
  a first driver having a supply terminal coupled to the fourth conductor, and further having an output coupled to the gate of the second transistor,
 wherein the semiconductor chip further comprises a second driver having a supply terminal coupled to the fourth conductor and an output coupled to the gate of the first transistor.

11. The apparatus of claim 10, wherein the semiconductor chip further comprises:
 fifth and sixth conductors extending outside the semiconductor chip; and
 a third transistor having a gate, a first source/drain node coupled to the fifth conductor, and a second source/drain node coupled to the sixth conductor.

12. The apparatus of claim 11, wherein the load is disposed outside the semiconductor chip, and the load has a first terminal coupled to the second conductor and a second terminal coupled to the fifth conductor.

13. The apparatus of claim 10, wherein:
 the semiconductor chip further comprises:
  a fifth conductor extending outside the semiconductor chip, and
  a controller configured to control an on/off state of the first transistor and second transistors, and further having an output coupled to the fifth conductor, and
 the first driver has an input coupled to the fifth conductor.

14. The apparatus of claim 10, wherein the first driver comprises a third transistor having a load path coupled between the gate of the second transistor and the fourth conductor.

15. The apparatus of claim 10, wherein the first driver comprises:
 a third transistor having a control terminal, and further having a load path coupled between the first source/drain node of the second transistor and the gate of the second transistor; and
 a fourth transistor having a load path coupled between the control terminal of the third transistor and the fourth conductor.

16. An apparatus for driving a load, comprising:
 a housing, comprising:
  a semiconductor chip,
  a first transistor disposed on the semiconductor chip and having a load path and a gate,
  a fracture sensor disposed on the semiconductor chip,
  a first conductive pin disposed outside the semiconductor chip and coupled to the load path of the first transistor,
  a first driver configured to drive the gate of the first transistor and having a supply input coupled to the fracture sensor,
  a second conductive pin disposed outside the semiconductor chip and coupled to the fracture sensor; and
 a circuit disposed outside the housing and comprising:
  a second driver coupled to the second conductive pin, and
  a second transistor coupled to the second driver and having a load path coupled to the first conductive pin and a control node coupled to the second conductive pin.

17. The apparatus of claim 16, wherein the housing further comprises:
 a third conductive pin disposed outside the semiconductor chip and coupled to the load path of the first transistor;
 a third transistor disposed on the semiconductor chip and having a load path; and
 a fourth conductive pin disposed outside the semiconductor chip and coupled to the load path of the third transistor.

18. The apparatus of claim 16, wherein the housing further comprises:
 a controller configured having a first output configured to control an on/off state of the first transistor and a second output configured to control an on/off state of the second transistor; and
 a third conductive pin disposed outside the semiconductor chip and coupled to the second output of the controller and to an input of the driver,
 wherein the second conductive pin is coupled to a supply terminal of the driver.

19. The apparatus of claim 1, wherein the semiconductor chip further comprises a third switch coupled in series with the first and second switches and the load wherein the third switch is configured such that an on/off state of the third switch is set in accordance with the state of the fracture sensor.

20. The apparatus of claim 11, further comprising a third driver having a supply terminal coupled to the fourth conductor and an output coupled to the gate of the third transistor.

* * * * *